(12) United States Patent
Hashimoto

(10) Patent No.: US 7,777,332 B2
(45) Date of Patent: Aug. 17, 2010

(54) SEMICONDUCTOR DEVICE

(75) Inventor: Nobuaki Hashimoto, Suwa (JP)

(73) Assignee: Seiko Epson Corporation (JP)

(*) Notice: Subject to any disclaimer, the term of this patent is extended or adjusted under 35 U.S.C. 154(b) by 308 days.

(21) Appl. No.: 11/583,687

(22) Filed: Oct. 19, 2006

(65) Prior Publication Data
US 2007/0108607 A1    May 17, 2007

(30) Foreign Application Priority Data
Nov. 7, 2005    (JP)    ............................. 2005-322503

(51) Int. Cl.
*H01L 23/48*    (2006.01)
(52) U.S. Cl. ................. 257/737; 257/734; 257/E23.02; 257/E23.021
(58) Field of Classification Search ................. 257/734, 257/737, 738, 741, 746–750, 753, 759, 773, 257/778, 782–786, E23.019, E23.02, E23.021; 438/612–615
See application file for complete search history.

(56) References Cited

U.S. PATENT DOCUMENTS

| 5,422,516 | A  | * | 6/1995  | Hosokawa et al. .......... 257/775 |
| 5,508,228 | A  | * | 4/1996  | Nolan et al. ............... 438/614 |
| 6,277,222 | B2 |   | 8/2001  | Morimoto et al. |
| 6,396,145 | B1 |   | 5/2002  | Nagai et al. |
| 6,847,101 | B2 | * | 1/2005  | Fjelstad et al. .............. 257/668 |
| 7,141,877 | B2 | * | 11/2006 | Abe et al. .................... 257/737 |
| 7,164,208 | B2 |   | 1/2007  | Kainou et al. |
| 7,166,920 | B2 | * | 1/2007  | Saito et al. .................. 257/738 |
| 7,285,734 | B2 | * | 10/2007 | Imamura et al. ............ 174/534 |
| 2007/0063345 | A1 | | 3/2007 | Hashimoto |
| 2007/0072405 | A1 | | 3/2007 | Kainou et al. |

FOREIGN PATENT DOCUMENTS

| JP | 02-272737   | 11/1990 |
| JP | 07-122700   | 5/1995  |
| JP | 11-312711   | 11/1999 |
| JP | 2000-252320 | 9/2000  |
| JP | 2001-110831 | 4/2001  |
| JP | 2003-045911 | 2/2003  |
| JP | 2003-059959 | 2/2003  |
| JP | 2005-136402 | 5/2005  |
| JP | 2005-236262 | 9/2005  |
| JP | 2005-310815 | 11/2005 |
| JP | 2007-48812  | 2/2007  |
| WO | WO99-65075  | 12/1999 |

* cited by examiner

*Primary Examiner*—Zandra Smith
*Assistant Examiner*—Paul E Patton
(74) *Attorney, Agent, or Firm*—Harness, Dickey & Pierce, P.L.C.

(57) ABSTRACT

A semiconductor device including: a semiconductor chip having a rectangular surface on which a plurality of electrodes are formed; a plurality of resin protrusions formed on the surface of the semiconductor chip; and a plurality of interconnects each of which is electrically connected to one of the electrodes and includes an electrical connection section disposed on one of the resin protrusions. At least part of the resin protrusions are disposed in a region near a short side of the surface and extend in a direction which intersects the short side.

14 Claims, 3 Drawing Sheets

SEMICONDUCTOR DEVICE

Japanese Patent Application No. 2005-322503, filed on Nov. 7, 2005, is hereby incorporated by reference in its entirety.

BACKGROUND OF THE INVENTION

The present invention relates to a semiconductor device.

An electronic module is known in which a semiconductor device (see JP-A-2-272737, for example) is mounted on an interconnect substrate or the like. The semiconductor device or the interconnect substrate may expand or shrink due to a change in temperature caused by a change in the operation environment of the electronic module or a change in temperature caused by a thermal cycle test, for example. A force may occur at the interface between the semiconductor device and the interconnect substrate when the thermal expansion coefficient of the semiconductor device differs from the thermal expansion coefficient of the interconnect substrate, for example. A highly reliable electronic module can be provided if a malfunction of the semiconductor device can be prevented even when the force becomes excessively high.

SUMMARY

According to one aspect of the invention, there is provided a semiconductor device comprising:

a semiconductor chip having a rectangular surface on which a plurality of electrodes are formed;

a plurality of resin protrusions formed on the surface of the semiconductor chip; and a plurality of interconnects each of which is electrically connected to one of the electrodes and includes an electrical connection section disposed on one of the resin protrusions, at least part of the resin protrusions being disposed in an end portion near a short side of the surface and extending in a direction which intersects the short side.

DETAILED DESCRIPTION OF THE EMBODIMENT

Figure 1A:
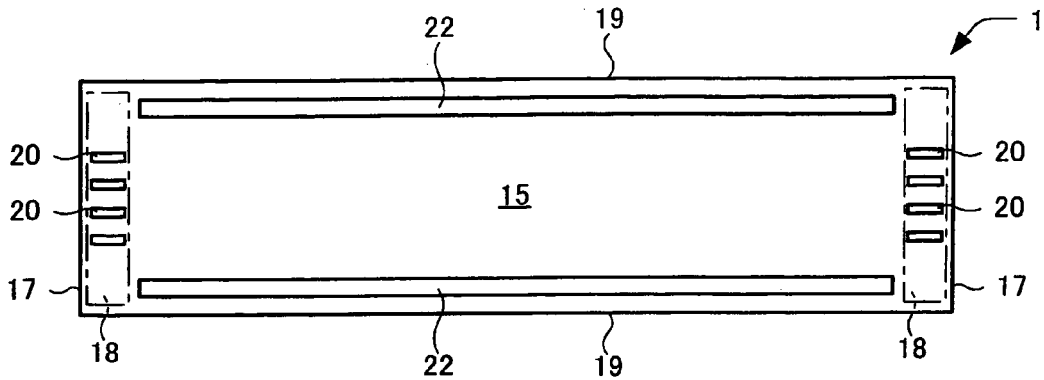
FIGS. 1A to 1D are views illustrative of a semiconductor device according to one embodiment of the invention.

The invention may provide a highly reliable semiconductor device.

(1) According to one embodiment of the invention, there is provided a semiconductor device comprising:

a semiconductor chip having a rectangular surface on which a plurality of electrodes are formed;

a plurality of resin protrusions formed on the surface of the semiconductor chip; and a plurality of interconnects each of which is electrically connected to one of the electrodes and includes an electrical connection section disposed on one of the resin protrusions, at least part of the resin protrusions being disposed in an end portion near a short side of the surface and extending in a direction which intersects the short side.

According to this embodiment, the resin protrusions disposed in the end portion is deformed to only a small extent. Therefore, it is possible to provide a highly reliable semiconductor device which can ensure electrical connection reliability even if the semiconductor device expands or shrinks due to a change in temperature or the like after mounting the semiconductor device.

(2) In this semiconductor device, at least part of the resin protrusions may be disposed in the end portion and extend in a direction perpendicular to the short side.

(3) In this semiconductor device, at least part of the resin protrusions may be disposed in the end portion and extend along imaginary straight lines radiating from a center portion of the surface.

(4) In this semiconductor device, two or more of the resin protrusions disposed in the end portion and extending in a direction intersecting the short side may be arranged along the short side.

(5) In this semiconductor device, all of the resin protrusions may extend in a direction intersecting the short side.

Embodiments of the invention will be described below with reference to the drawings. Note that the invention is not limited to the following embodiments. The invention also includes a configuration in which the following features are arbitrarily combined.

FIGS. 1A to 3 are views illustrative of a semiconductor device according to an embodiment to which the invention is applied. FIGS. 1A to 1D are views showing a semiconductor device 1 according to an embodiment to which the invention is applied. FIG. A is a top view of the semiconductor device 1. In FIG. A, electrodes 14 and interconnects 30 (electrical connection sections 32) are omitted for convenience of explanation. FIG. 1B is a partially enlarged view of FIG. 1A. FIG. 1C is a partially enlarged cross-sectional view taken along the line IC-IC shown in FIG. 1B, and FIG 1D is a partially enlarged cross-sectional view taken along the line ID-ID shown in FIG. 1B.

As shown in FIGS. 1A to 1D, the semiconductor device according to this embodiment includes a semiconductor chip 10. The semiconductor chip 10 may be a silicon chip, for example. An integrated circuit 12 may be formed on the semiconductor chip 10 (see FIG. 1D). The configuration of the integrated circuit 12 is not particularly limited. For example, the integrated circuit 12 may include an active element such as a transistor and a passive element such as a resistor, a coil, or a capacitor.

Figure 1B:
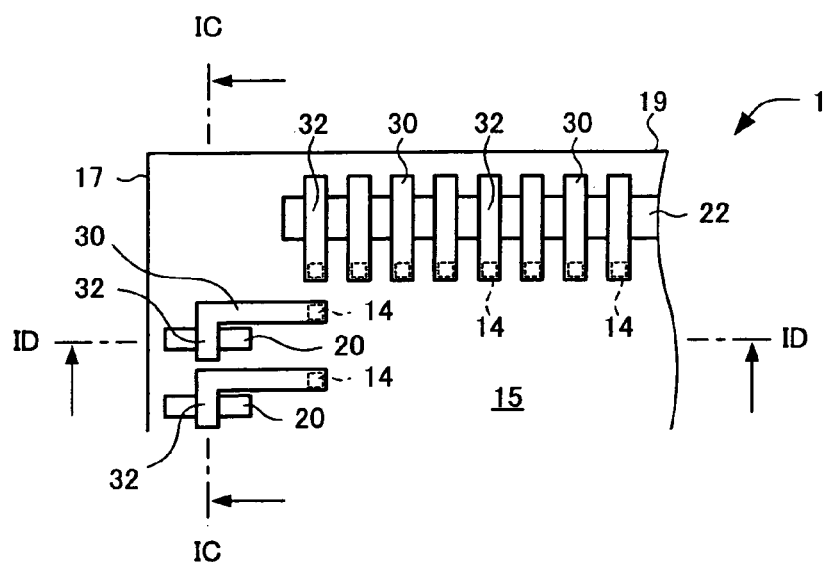

As shown in FIG. 1B, a plurality of electrodes 14 are formed on the semiconductor chip 10. A surface 15 of the semiconductor chip 10 on which the electrodes 14 are formed is rectangular, as shown in FIG. 1A. The surface 15 may be the active surface of the semiconductor chip 10. In other words, the surface 15 of the semiconductor chip 10 may be a surface on which the integrated circuit 12 is formed. The electrodes 14 may be formed only on the peripheral portion of the surface 15 to avoid the center portion of the surface 15. The electrodes 14 may be formed on the surface 15 in an area array (in a region including the center portion). In this case, the electrodes may be arranged in rows and columns in the shape of a lattice, or may be arranged randomly.

Figure 1C:
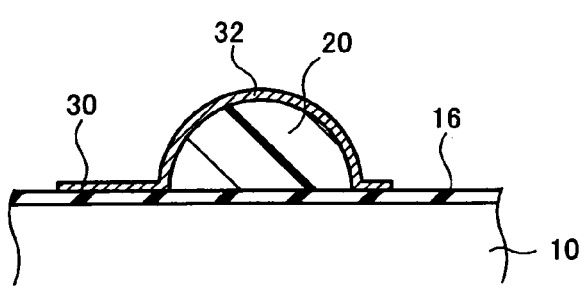
Figure 1D:
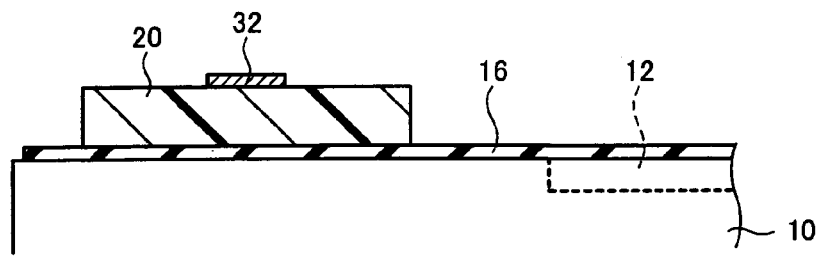

The electrodes 14 may be electrically connected with the integrated circuit 12. A conductor which is not electrically connected with the integrated circuit 12 may also be called the electrode 14. The electrode 14 may be part of an internal interconnect of the semiconductor chip. The electrode 14 may be formed of a metal such as aluminum or copper. As shown in FIGS. 1C and 1D, a passivation film 16 may be formed on the surface 15 of the semiconductor chip 10. In this case, the electrode 14 may be a region exposed from the passivation film 16. The passivation film may be an inorganic insulating film formed of $SiO_2$, SiN, or the like. The passivation film 16 may be an organic insulating film formed of a polyimide resin or the like.

The semiconductor device according to this embodiment includes resin protrusions 20, as shown in FIGS. 1A to 1D. The resin protrusions 20 are formed on the semiconductor chip 10. The resin protrusions 20 may be formed on the passivation film 16. The resin protrusions 20 may be formed to avoid (expose) the electrodes 14.

The resin protrusions 20 are formed on the surface (surface 15) of the semiconductor chip 10 on which the electrodes 14 are formed. The resin protrusions 20 may be disposed in a region of the surface 15 outside the electrodes 14. At least part of the resin protrusions 20 may be disposed in an end portion 18 near a short side 17 of the surface 15. Alternatively, all of the resin protrusions 20 may be disposed in the end portion 18. The end portion 18 near the short side 17 may refer to a region near the short side 17 of the surface 15. The end portion 18 near the short side 17 may refer to a square region having the short side 17 as one side, within the surface 15. The end portion 18 near the short side 17 may have a width which is equal to the thickness of the semiconductor chip 10 from the short side 17. The end portion 18 near the short side 17 may refer to a region outside the region in which the integrated circuit 12 is formed.

As shown in FIGS. 1A and 1B, the resin protrusions 20 in the end portion 18 of the short side 17 of the surface 15 extend in a direction which intersects the short side 17. The resin protrusions 20 in the end portion 18 may extend in a direction perpendicular to the short side 17. In the semiconductor device according to this embodiment, a plurality of resin protrusions 20 extending in the direction which intersects the short side 17 may be arranged along the short side 17, as shown in FIG 1A. As shown in FIG. 1A, the resin protrusions 20 in the end portion 18 may be arranged in a single row along each of the short side 17. The resin protrusions 20 in the end portion 18 may be arranged in a plurality of rows (not shown). This allows an increase in the area where the electrical connection sections 32 (described later) can be formed, whereby a number of connection points can be obtained without increasing the external shape of the semiconductor chip 10. Moreover, the degrees of freedom of the arrangement of the electrical connection sections 32 can be increased.

As shown in FIGS. 1A and 1B, the semiconductor device according to this embodiment may include another resin protrusion 22 formed on the surface 15 of the semiconductor chip 10. The resin protrusion 22 may extend along a long side 19 of the surface 15. In other words, in the semiconductor device according to this embodiment, all of the resin protrusions may extend in the direction which intersects the short side 17. Only one resin protrusion 22 may be formed along the long side 19 of the surface 15, as shown in FIG. 1A. Alternatively, a plurality of resin protrusions may be formed along the long side 19 of the surface 15 (not shown). As shown in FIG. 1A, the resin protrusion 22 may be formed to avoid the end portion 18, or the resin protrusion 22 may be formed to extend over the end portion 18. In the latter case, the resin protrusion may also extend in the direction which intersects the short side 17 in the end portion 18.

The material for the resin protrusions 20 and 22 is not particularly limited. A known material may be used for the resin protrusions 20 and 22. For example, the resin protrusions 20 and 22 may be formed of a resin such as a polyimide resin, a silicone-modified polyimide resin, an epoxy resin, a silicone-modified epoxy resin, benzocyclobutene (BCB), polybenzoxazole (PBO), or a phenol resin.

As shown in FIGS. 1B to 1D, the semiconductor device according to this embodiment includes the interconnect 30 electrically connected with the electrode 14 and including the electrical connection section 32 disposed on the resin protrusion 20. For example, the electrical connection section 32 may refer to part (region overlapping the resin protrusion 20) of the interconnect 30 which is pulled out from the electrode 14 and extends over the resin protrusion 20. In this case, the electrical connection section 32 may refer to part of the interconnect 32 used as an external terminal. The electrical connection section 32 may have a shape extending along the short side 17. In this case, the electrical connection section 32 may have a shape extending to perpendicularly intersect the resin protrusion 20. Only one electrical connection section 32 may be formed on one resin protrusion 20, as shown in FIG. 1B. The electrical connection section 32 may be disposed to overlap the end portion 18.

The structure and the material for the interconnect 30 (electrical connection section 32) are not particularly limited. For example, the interconnect 30 may be formed of a single layer. Alternatively, the interconnect 30 may be formed of a plurality of layers. In this case, the interconnect 30 may include a first layer formed of titanium tungsten and a second layer formed of gold (not shown).

The semiconductor device 1 according to this embodiment may have the above-described configuration. According to the semiconductor device 1, it is possible to provide a highly reliable semiconductor device in which the interconnect 30 is hardly damaged during and after mounting. The effects of the semiconductor device 1 are described below.

The method of mounting the semiconductor device 1 on an interconnect substrate is not particularly limited. An example of the mounting method is described below with reference to FIGS. 2A and 2B. First, an interconnect substrate 40 is explained. The interconnect substrate 40 may include a base substrate 42 and an interconnect pattern 44. The material for the base substrate 42 is not particularly limited. The material for the base substrate 42 may be an organic or inorganic material, or may be a composite material of organic and inorganic materials. A substrate formed of an inorganic material may be used as the base substrate 42. In this case, the base substrate 42 may be a ceramic substrate or a glass substrate. When the base substrate 42 is a glass substrate, the interconnect substrate 40 may be part of an electro-optical panel (e.g. liquid crystal panel or electroluminescent panel). The interconnect pattern 44 may be formed of a film formed of a metal or a metal compound such as indium tin oxide (ITO), Cr, or Al, or may be formed of a composite of these films. The interconnect pattern 44 may be electrically connected with an electrode for driving a liquid crystal (e.g. scan electrode, signal electrode, or common electrode). The base substrate 42 may be a substrate or a film formed of polyethylene terephthalate (PET). A flexible substrate formed of a polyimide resin may be used as the base substrate 42. A tape used in flexible printed circuit (FPC) technology or tape automated bonding (TAB) technology may be used as the flexible substrate. In this case, the interconnect pattern 44 may be formed by stacking any of copper (Cu), chromium (Cr), titanium (Ti), nickel (Ni), and titanium tungsten (Ti—W), for example.

Figure 2A:
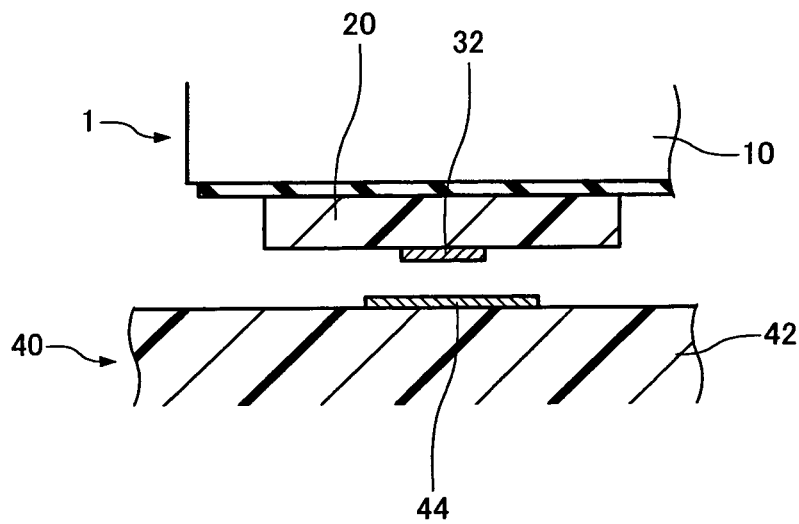
FIGS. 2A and 2B are views illustrative of a semiconductor device according to one embodiment of the invention.

A step of mounting the semiconductor device 1 on the interconnect substrate 40 is described below. As shown in FIG. 2A, the semiconductor device 1 is disposed on the interconnect substrate 40 and positioned so that the electrical connection section 32 (resin protrusion 20) of the semiconductor device 1 faces the interconnect pattern 44 of the interconnect substrate 40.

The semiconductor device 1 may be held using a jig (bonding tool) (not shown). The jig may have a built-in heater. The semiconductor device 1 (electrical connection section 32) may be heated using the heater. The electrical connection section 32 is heated by heating the semiconductor device 1 to ensure reliable electrical connection between the electrical connection section 32 and the interconnect pattern 44.

An adhesive (not shown) may be provided between the semiconductor device 1 and the interconnect substrate 40. An adhesive in the form of a film may be used, for example. An adhesive in the form of a paste may also be used as the adhesive. The adhesive may be an insulating adhesive. The adhesive may be a resin-based adhesive.

Figure 2B:
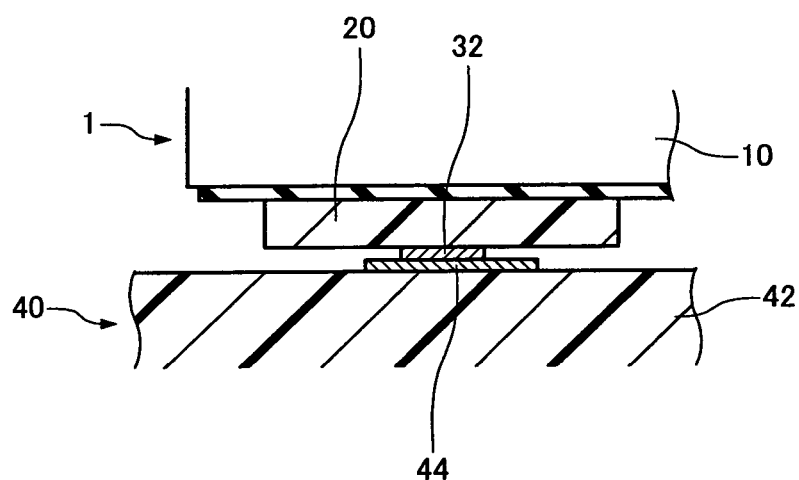
Figure 3:
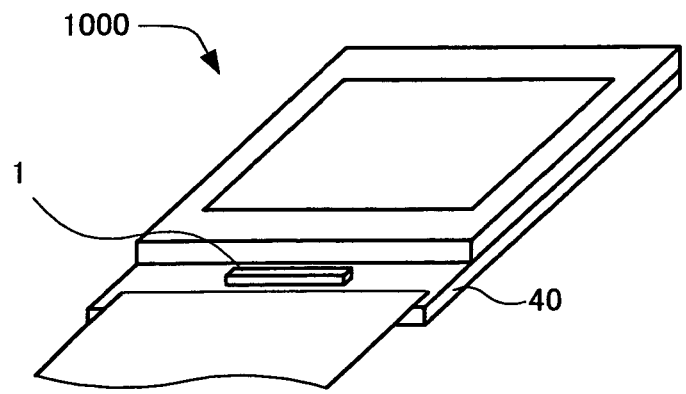
FIG. 3 is a view illustrative of a semiconductor device according to one embodiment of the invention.

As shown in FIG. 2B, the semiconductor device 1 is positioned close to the interconnect substrate 40 so that the electrical connection section 32 is brought into contact with the interconnect pattern 44. This allows the electrical connection section 32 to be electrically connected with the interconnect pattern 44. In this step, the resin protrusion 20 may be crushed and elastically deformed using the semiconductor chip 10 and the interconnect substrate 40. As a result, the electrical connection section 32 can be pressed against the interconnect pattern 44 due to the elastic force of the resin protrusion 20, thus enabling an electronic module with high electrical connection reliability to be manufactured.

An adhesive layer (not shown) may be formed between the semiconductor device 1 and the interconnect substrate 40. The interval between the semiconductor chip 10 and the interconnect substrate 40 may be maintained using the adhesive layer. In other words, the elastically-deformed state of the resin protrusion 20 may be maintained using the adhesive layer. For example, the elastically-deformed state of the resin protrusion 20 may be maintained by forming the adhesive layer while the resin protrusion 20 is elastically deformed.

The semiconductor device 1 may be mounted on the interconnect substrate 40 by the above steps. An inspection step and the like may be further performed to obtain an electronic module 1000 shown in FIG. 3. The electronic module 1000 may be a display device. The display device may be a liquid crystal display device, an electroluminescent (EL) display device, or the like. The semiconductor device 1 (semiconductor chip 10) may be a driver IC which controls the display device.

The size of the semiconductor device 1 and the interconnect substrate 40 may be changed during the above-mentioned mounting step or after the mounting step. For example, in the step of mounting the semiconductor device I on the interconnect substrate 40, the semiconductor device 1 and the interconnect substrate 40 are cooled when heat supply from the jig stops after providing the semiconductor device 1 on the interconnect substrate 40, and shrink to have a decreased external size. The size of the semiconductor device 1 and the interconnect substrate 40 is also changed due to a change in the operation environment after mounting or a thermal cycle test conducted for inspection.

In the semiconductor device 1, the resin protrusion 20 is formed on the semiconductor chip 10. Therefore, the position of the base portion of the resin protrusion 20 is changed to follow a change in size of the semiconductor chip 10. The top portion of the resin protrusion 20 is pressed against the interconnect substrate 40 through the electrical connection section 32. Therefore, the position of the top portion of the resin protrusion 20 is changed to follow a change in size of the interconnect substrate 40 (change in position of interconnect pattern 44). In summary, the position of the base portion of the resin protrusion 20 is changed to follow a change in size of the semiconductor chip 10, and the position of the top portion of the resin protrusion 20 is changed to follow a change in size of the interconnect substrate 40. Therefore, if the rate or direction of a change in size differs between the semiconductor device 1 (semiconductor chip 10) and the interconnect substrate 40 (interconnect pattern 44), a force may be applied to the resin protrusion 20.

Since the semiconductor chip 10 is rectangular, a change in size significantly occurs in the end portion 18 of the short side 17. Therefore, the size of the surface 15 of the semiconductor chip 10 changes significantly in the end portion 18 of the short side 17 as compared with the center region. In the end portion of the short side of the semiconductor chip 10, the amount of change in size along the long side 19 is larger than the amount of change in size along the short side 17. Therefore, it is expected that a large amount of force is applied to the resin protrusion 20 in the end portion 18 of the short side 17 of the semiconductor chip 10 in the direction which intersects the short side 17 of the semiconductor chip 10.

If a large amount of force is applied to the resin protrusion 20, the resin protrusion 20 may be deformed. In the semiconductor device 1, the electrical connection section 32 is provided on the resin protrusion 20, or the interconnect 30 is formed to extend over the resin protrusion 20. Therefore, if the resin protrusion 20 is deformed, a force may be applied to the interconnect 30 or the electrical connection section 32, whereby the interconnect 30 and the electrical connection section 32 may be damaged.

In the semiconductor device 1, the resin protrusion 20 disposed in the end portion 18 of the short side 17 of the semiconductor chip 10 has a shape extending in the direction which intersects the short side 17. Specifically, the resin protrusion 20 has a shape which is hardly deformed even if a force is applied to the resin protrusion 20 in the direction which intersects the short side 17. Therefore, the semiconductor device 1 allows provision of a highly reliable semiconductor device in which the electrical connection section 32 (interconnect 30) formed over the resin extrusion 20 is hardly damaged, even if the semiconductor chip 10 is rectangular.

In the semiconductor device 1, the electrical connection section 32 (interconnect 30) may have a shape extending over the resin protrusion 20 along the short side 17. This allows the electrical connection section 32 to have an increased width in the end portion 18 of the semiconductor chip 10 in the direction of expansion or shrinkage of the semiconductor chip 10. Therefore, the electrical connection section 32 is hardly damaged in the end portion 18 of the semiconductor chip 10, even if the semiconductor device 1 expands or shrinks. In this case, the apparent width of the electrical connection section 32 can be increased without increasing the width of the interconnect 30, whereby routing of the interconnect 30 is facilitated.

Modification

The invention is not limited to the above embodiment and various modifications are possible. A semiconductor device according to a modification of the embodiment to which the invention is applied is described below.

Figure 4:
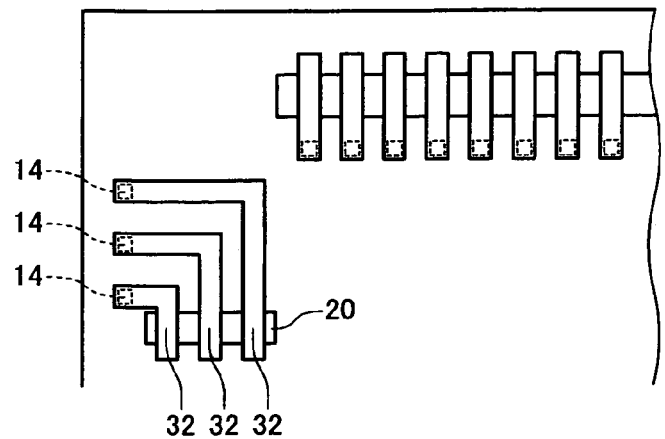
FIG. 4 is a view illustrative of a semiconductor device according to a modification of one embodiment of the invention.

As shown in FIG. 4, a plurality of electrical connection sections 32 may be formed on one resin protrusion 20.

According to this modification, since the electrical connection sections 32 can be formed densely, the number of electrical connection sections 32 can be increased without increasing the external shape of the semiconductor chip 10 (semiconductor device 1). As shown in FIG. 4, the resin protrusions 20 may be disposed inside the electrodes 14.

Figure 5:
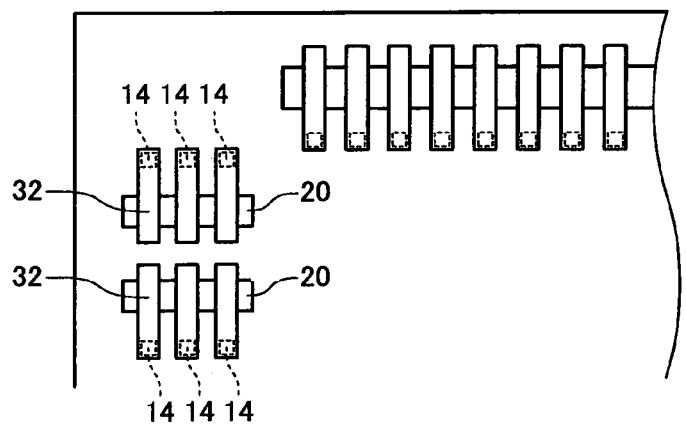
FIG. 5 is a view illustrative of a semiconductor device according to a modification of one embodiment of the invention.

In the example shown in FIG. 5, a plurality of electrical connection sections 32 are formed on one resin protrusion 20. The electrical connection sections 32 formed on one resin protrusion 20 are electrically connected with a plurality of electrodes 14 disposed along the resin protrusion 20. This allows the length of the interconnect 30 to be constant, whereby a semiconductor device which can accurately transmit signals can be provided.

Figure 6:
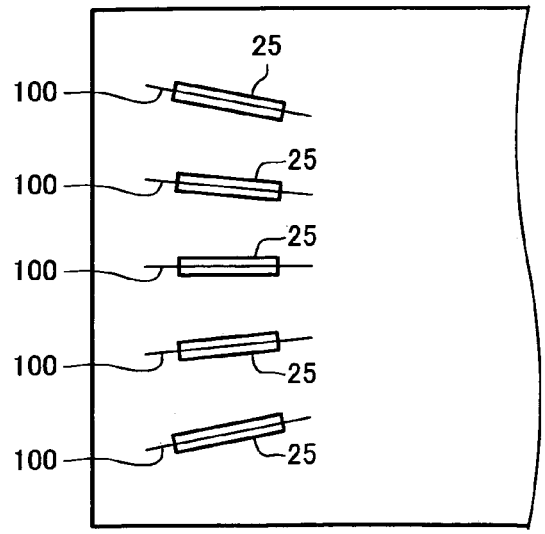
FIG. 6 is a view illustrative of a semiconductor device according to a modification of one embodiment of the invention.

In the example shown in FIG. 6, the semiconductor device includes resin protrusions 25. The resin protrusion 25 has a shape extending along an imaginary straight line 100 radially extending from the center region of the surface 15. The semiconductor chip 10 may radially expand from or shrink toward the center region due to a change in temperature. According to this modification, if the semiconductor chip 10 radially expands from or shrinks toward the center region, deformation of the resin protrusion can be more reliably prevented. In this case, the electrical connection section 32 may have a shape extending along the short side 17 or a shape extending to perpendicularly intersect the resin protrusion 25.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A semiconductor device comprising:
a semiconductor chip having a rectangular surface on which a plurality of electrodes are formed, the rectangular surface having a short side extending in a first direction;
a plurality of resin protrusions arranged in the first direction in an end portion of the rectangular surface near the short side, each of the resin protrusions extending in a direction intersecting the first direction;
a plurality of interconnects each of which is electrically connected to one of the electrodes and includes a portion disposed on one of the resin protrusions,
the electrodes being spaced apart from the resin protrusions, and
the portion extending in the first direction.

2. The semiconductor device as defined in claim 1,
at least part of the resin protrusions extending in a direction perpendicular to the short side.

3. The semiconductor device as defined in claim 1,
the resin protrusions extending in a different direction from directions in which adjacent resin protrusions extend.

4. The semiconductor device as defined in claim 1,
the electrodes being arranged in the first direction.

5. The semiconductor device as defined in claim 1,
the electrodes being arranged in a direction intersecting the first direction.

6. The semiconductor device as defined in claim 1,
the resin protrusions being semi-circular column shaped.

7. A semiconductor device comprising:
a semiconductor chip having a rectangular surface, the rectangular surface having a short side extending in a first direction;
a plurality of resin protrusions arranged along the short side of the rectangular surface, each of the resin protrusions extending in a direction intersecting the first direction;
a plurality of electrodes on the rectangular surface, the electrodes being spaced apart from the resin protrusions; and
a plurality of interconnects, each interconnect being electrically connected to one of the electrodes and including a portion extending in the first direction.

8. The semiconductor device as defined in claim 7,
at least a part of each resin protrusion extending in a direction perpendicular to the first direction.

9. The semiconductor device as defined in claim 7,
adjacent resin protrusions extending in directions that are different from each other.

10. The semiconductor device as defined in claim 7,
the portion of each of the interconnects being on one of the resin protrusions.

11. The semiconductor device as defined in claim 7,
the portion of at least one of the interconnects being on one of the resin protrusions.

12. The semiconductor device as defined in claim 7,
the electrodes being arranged in the first direction.

13. The semiconductor device as defined in claim 7,
the electrodes being arranged in a direction intersecting the first direction.

14. The semiconductor device as defined in claim 7,
the resin protrusions having a semi-circular cross-sectional shape.

* * * * *